US009293909B2

(12) United States Patent
Wildner et al.

(10) Patent No.: US 9,293,909 B2
(45) Date of Patent: Mar. 22, 2016

(54) PASSIVE CIRCUIT FOR IMPROVED FAILURE MODE HANDLING IN POWER ELECTRONICS MODULES

(75) Inventors: Franz Wildner, Wittnau (CH); Thomas Christen, Birmenstorf (CH); Thorsten Strassel, Mülligen (CH)

(73) Assignee: ABB RESEARCH LTD, Zürich (CH)

( * ) Notice: Subject to any disclaimer, the term of this patent is extended or adjusted under 35 U.S.C. 154(b) by 0 days.

(21) Appl. No.: 14/395,791

(22) PCT Filed: Apr. 20, 2012

(86) PCT No.: PCT/EP2012/057278
§ 371 (c)(1),
(2), (4) Date: Nov. 25, 2014

(87) PCT Pub. No.: WO2013/156078
PCT Pub. Date: Oct. 24, 2013

(65) Prior Publication Data
US 2015/0085415 A1  Mar. 26, 2015

(51) Int. Cl.
H02H 3/08 (2006.01)
H03K 17/0812 (2006.01)
H02H 1/06 (2006.01)
H02H 7/12 (2006.01)

(52) U.S. Cl.
CPC ............... *H02H 3/08* (2013.01); *H02H 1/063* (2013.01); *H03K 17/08128* (2013.01); *H02H 7/12* (2013.01)

(58) Field of Classification Search
CPC ........... H02H 3/08; H02H 7/12; H02H 1/063; H03K 17/06
USPC .......................................... 361/93.1
See application file for complete search history.

(56) References Cited

U.S. PATENT DOCUMENTS

| 3,782,353 | A  | * | 1/1974  | Kammerer et al. ........... 123/596 |
| 3,906,415 | A  | * | 9/1975  | Baker ............................. 335/47 |
| 7,206,179 | B2 | * | 4/2007  | Miyamoto .................... 361/118 |
| 7,538,436 | B2 |   | 5/2009  | Gunturi et al. |
| 2007/0188959 | A1 | * | 8/2007 | Akerlund et al. ............ 361/93.1 |
| 2012/0099234 | A1 | * | 4/2012 | Inoue et al. ..................... 361/87 |
| 2012/0262218 | A1 | * | 10/2012 | Klaka et al. .................... 327/383 |

FOREIGN PATENT DOCUMENTS

EP  2330740 A1  6/2011

* cited by examiner

*Primary Examiner* — Thienvu Tran
*Assistant Examiner* — Lucy Thomas
(74) *Attorney, Agent, or Firm* — Birch, Stewart, Kolasch & Birch, LLP

(57) ABSTRACT

A power electronics module for enhancing short circuit failure mode (SCFM) transitions. The module is adapted to disconnect a gate unit from the module using a first switch, upon a failure of at least one of a plurality of semiconductor chips during which the failed chip enters an SCFM, and connect a passive circuit arrangement, including at least one capacitor and at least one resistor, to the module using a second switch. The passive circuit arrangement is adapted to switch on at least one of the remaining non-failed semiconductor chips.

6 Claims, 2 Drawing Sheets

PASSIVE CIRCUIT FOR IMPROVED FAILURE MODE HANDLING IN POWER ELECTRONICS MODULES

TECHNICAL FIELD

The present invention relates to the technical field of power electronics (PE). In particular, it concerns enhancing short circuit failure mode (SCFM) transitions in a PE module.

BACKGROUND

Voltage source converters (VSC) are power switches comprising a plurality of semiconductor chips such as e.g. insulated gate bipolar transistor (IGBT) power modules. They are often used in high-voltage direct current (HVDC) applications for converting direct current to alternating current and vice-versa or in static var compensators (SVC) for reactive power compensation in power transmission systems.

Semiconductor chips such as IGBTs and gate turnoff (GTO) thyristors are suitable for high power applications. IGBTs are often preferable as they combine great power handling ability with features that make them well suited for connection in series and/or in parallel.

Short circuit situations may occur in PE modules. In such situations it is necessary to be able to handle the effect of the short circuit. When a semiconductor breaks down, e.g. as a result of an over current or over voltage, the semiconductor cannot hold a voltage any longer. A damaged semiconductor cannot be controlled. It may hold only a small voltage difference and when conducting its resistance can have a value within a broad range. In the worst case, forcing a current through a damaged semiconductor with high resistance can generate an arc that will generate extensive power dissipation.

One example of a power electronics module is described in U.S. Pat. No. 7,538,436 B2. Inside the module, semiconductor chips are arranged in parallel in order to increase the total current capability. The power electronics module has the ability to go into a stable short circuit failure mode (SCFM) in case of an IGBT or diode failure (due to e.g. cosmic radiation). When another IGBT or diode failure occur the module again enters an SCFM. This is called the SCFM transition. The PE modules are connected in series to obtain a valve with high blocking voltage. The blocking capability is taken over by the remaining modules in the stack in case of a short circuit in a module.

Accordingly, it is desirable to obtain an improved control of the SCFM transitions in power electronics modules.

SUMMARY

It is an object of the present invention to provide an improved alternative to the above techniques and prior art. More specifically, it is an object of the present invention to control SCFM transitions in a PE module.

To achieve these and other objects, a PE module in accordance with the independent claim is provided.

The invention is based on the insight that the appearance of arcing during the SCFM transition can be used as trigger signal and energy source to create new SCFMs in parallel. A circuit scheme is proposed which allows control of the arcing and improves the performance of the PE module. Further, an additional circuit scheme is proposed that leads to multiple SCFM generation by over-current. They enable an improved current distribution within the module and lead to a reduction of the thermal stress onto the cooling means. The increased control can either be employed for a prolonged service interval or an increased total current capability of the module. Furthermore, the circuit can repeat this SCFM transition procedure again when the SCFMs resistance becomes too high until all semiconductor chips in the module have been brought into SCFM.

One advantage with the concept of the present invention is that low-cost circuits can be implemented in the module, since no additional power source is needed.

Furthermore, the present solution provides a reliable transition mechanism with no time-critical sensors and actuators.

According to a first aspect of the invention, a PE module for controlling SCFM transitions including, a plurality of semiconductor chips connected in parallel, a gate unit (GU) and a passive circuit arrangement, is provided as defined in claim 1.

In accordance with an embodiment of the invention, the PE module includes a passive circuit arrangement, wherein the passive circuit arrangement comprises a parallel connection of at least one capacitor and at least one resistor. The module is adapted to use arcing of at least one semiconductor chip as energy source to charge the at least one capacitor. The gate voltage is then applied to the gate of the non-failed semiconductor chips and the passive circuit arrangement turns on at least one of the remaining non-failed plurality of semiconductor chips. Thereby new SCFMs can be created in parallel such that the current distribution is improved and the lifetime is extended.

In accordance with another embodiment of the invention, the PE module includes a plurality of resistors. The plurality of resistors have different resistance values, or optionally at least two of the plurality of resistors have the same resistance values. This way it is possible to control which of the remaining non-failed semiconductor chips to switch on. A single semiconductor chip, which is switched on by the PE module, can only end in SCFM if the overcurrent is sufficiently strong and lasting. Therefore the number of non-failed semiconductor chips needs to be controlled in case the present device current is well below the nominal current rating.

BRIEF DESCRIPTION OF THE DRAWINGS

Further characteristics and advantages of the present invention will emerge more clearly to a person skilled in the art from the following non-limited detailed description when considered in connection with the attached drawings, wherein.

DETAILED DESCRIPTION

Figure 1:
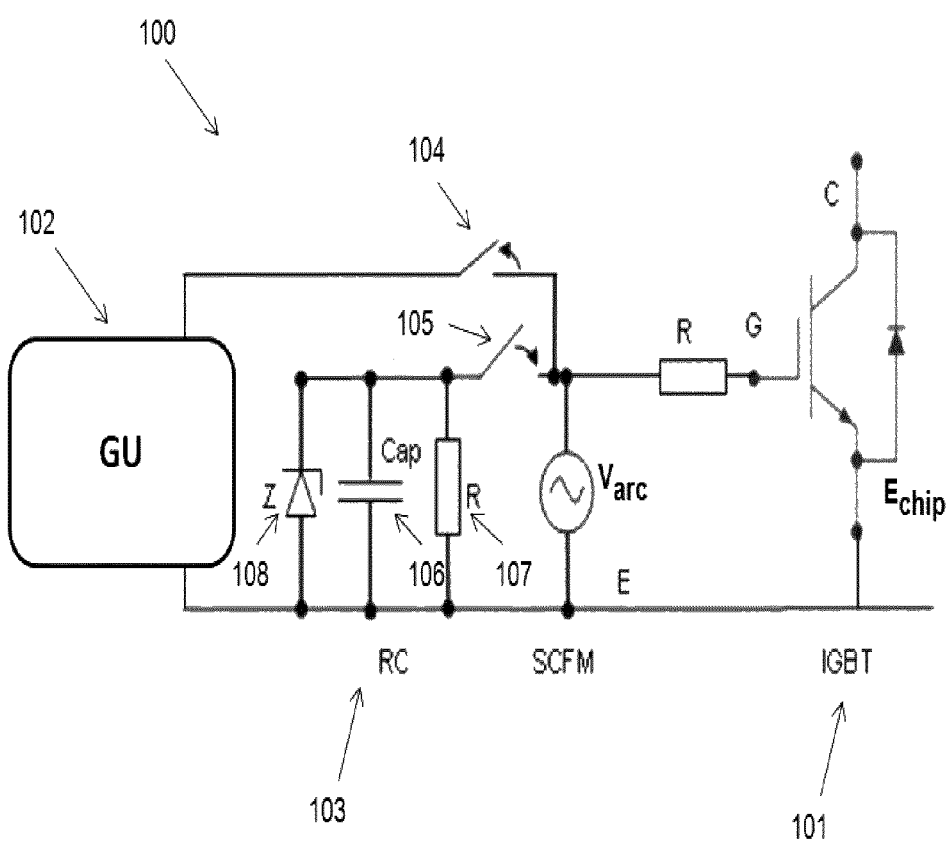
FIG. 1 shows a schematic drawing of a PE module in accordance with an exemplifying embodiment of the invention.

An embodiment for enhancing SCFM transitions in a PE module 100, is shown in FIG. 1. The PE module 100 comprises a plurality of semiconductor chips 101, for simplicity only one semiconducting chip is shown, a gate unit (GU) 102 and a passive circuit arrangement 103. The passive circuit arrangement 103 includes a parallel connection of at least one capacitor 106 and at least one resistor 107. The GU 103 is connected to the gates of the plurality of semiconductor chips 101 via a first switch 104 and the passive circuit arrangement 103 is connected to the gates of the plurality of semiconductor chips 101 via a second switch 105. The first and second switches 104, 105 are controlled by the GU 102. Optionally, the second switch 105 could be implemented by a relay for passive control of the semiconductor chips. During normal operation the first switch 104 is configured to be closed and the second switch 105 is configured to be open, in response to a signal provided by the GU 102. The signal could be e.g. a voltage, a current or an optical signal. After a failure of a semiconductor chip, the failed chip enters an SCFM. The GU 102 then detects the failure, by e.g. a voltage measurement, and subsequently powers down or it fails to operate. As the GU 102 applies no more signals to the control terminals of the first 104 and second 105 switches, the first switch 104 changes to an open position and thereby disconnecting the plurality of semiconductor chips 101 from the GU 102. The second switch 105 then changes to a closed position so that the passive circuit arrangement 103 is connected to the gates of the plurality of semiconductor chips 101. An arc voltage charges the capacitor 106 and the gate voltage is applied subsequently to the gate of the non-failed semiconductor chips. The passive circuit arrangement 103 turns on at least one of the remaining non-failed plurality of semiconductor chips. After being turned on, the at least one semiconductor chip takes most of the current and is able to extinct the arc. The thermal runaway of one or more semiconductor chips in on-state can trigger another chip failure and initiate the formation of another SCFM transition. The capacitor 106 stores sufficient energy to finish the SCFM transition process. A Zener diode 108 can optionally limit the voltage such that the gate is not damaged by an overvoltage.

Figure 2:
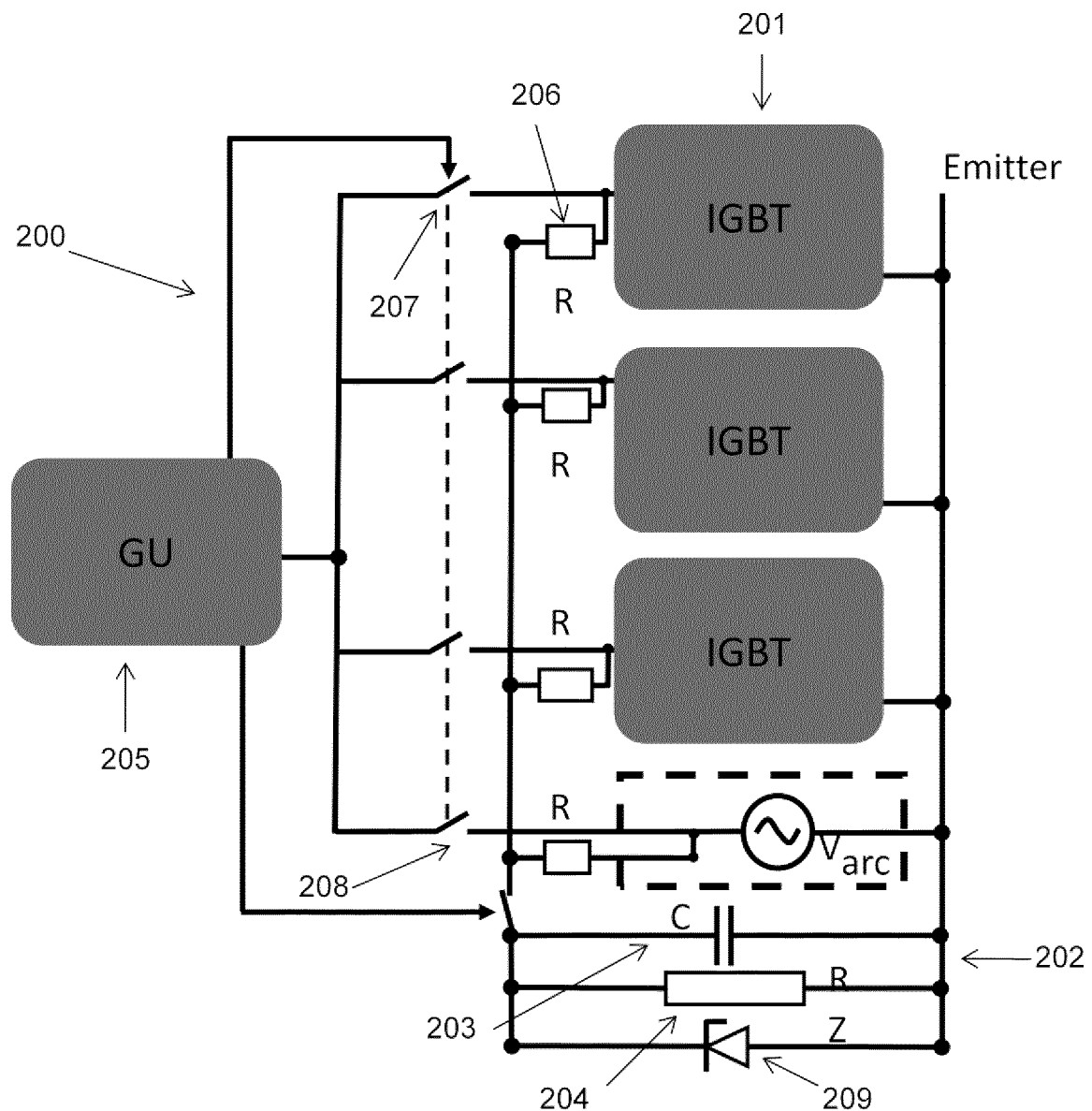
FIG. 2 shows a schematic drawing of a PE module in accordance with another exemplifying embodiment of the invention.

Another embodiment for enhancing SCFM transitions in a PE module 200, is shown in FIG. 2. The PE module 200 comprises a plurality of semiconductor chips 201, a gate unit (GU) 205 and a passive circuit arrangement 202. The passive circuit arrangement includes a parallel connection of at least one capacitor 203 and at least one resistor 204. The PE module 200 further includes a plurality of resistors 206 wherein each of the plurality of resistors 206 is connected to a respective gate or a respective set of gates of the plurality of semiconducting chips 201. The GU 205 is connected to the gates of the plurality of semiconductor chips 201 via a first switch 207 and the passive circuit arrangement 202 is connected to the gates of the plurality of semiconductor chips 201 via a second switch 208. The first and second switches 207, 208 are controlled by the GU 205. During normal operation the first switch 207 is configured to be closed and the second switch 208 is configured to be open, in response to a signal provided by the GU 205. The signal could be e.g. a voltage, a current or an optical signal. After a failure of a semiconductor chip 201, the failed chip enters an SCFM. The GU 205 detects the failure and opens the first switch 207 in order to disconnect the semiconductor chips 201 from the GU 205 and their gates from each other. Optionally, instead of having only one first switch 207 there could be a plurality of switches working synchronously, wherein each of the plurality of switches connects at least one semiconductor chip to the GU 205. The second switch 208 then changes to a closed position so that the passive circuit arrangement 202 is connected to the gates of the plurality of semiconductor chips 201. At the end of the life time of the SCFM arcing starts and charges the capacitor 203 which provides the energy and the voltage level to turn on the parallel, yet blocking, remaining non-failed plurality of semiconductor chips 201. In order to control which of the remaining non-failed semiconductor chips 201 to switch on, different input resistance values should be chosen for the plurality of resistors 206. A Zener diode 209 can optionally limit the voltage such that the gate is not damaged by an overvoltage.

The invention claimed is:

1. A power electronics, PE, module including, a plurality of semiconductor chips connected in parallel, a gate unit, GU, and a passive circuit arrangement, wherein the GU is connected to the gates of the plurality of semiconductor chips via a first switch and the passive circuit arrangement is connected to the gates of the plurality of semiconductor chips via a second switch, and wherein the passive circuit arrangement includes a parallel connection of at least one capacitor and at least one resistor, and wherein
　　the first switch is adapted to, under normal operation, have a closed position, and, upon a failure of at least one of the plurality of semiconductor chips change to an open position and thereby disconnect the plurality of semiconductor chips from the GU,
　　the second switch is adapted to, under normal operation, have an open position, and, upon a failure of at least one of the plurality of semiconductor chips change to a closed position, wherein the passive circuit arrangement is connected to the gates of the plurality of semiconductor chips, and wherein the passive circuit arrangement is adapted to switch on at least one of the remaining non-failed plurality of semiconductor chips,
　　said one or a plurality of semiconductor chips are configured to, following a chip failure, enter a short circuit failure mode (SCFM), and
　　the module is configured to charge the at least one capacitor with energy from arcing of said one of a plurality of semiconductor chips, and wherein the arcing occurs at the end of the lifetime of said SCFM.

2. The PE module according to claim 1, wherein the module further includes a plurality of resistors, and wherein each of the plurality of resistors is connected to a respective gate or a respective set of gates of the plurality of semiconducting chips.

3. The PE module according to claim 2, wherein the plurality of resistors have different resistance values for controlling which of the remaining non-failed semiconductor chips to switch on.

4. The PE module according to claim 2, wherein at least two of the plurality of resistors have the same resistance values for controlling which of the remaining non-failed semiconductor chips to switch on.

5. The PE module according to claim 1, wherein the semiconductor chips are included in the group of IGBT, BIGT, IGCT, MOSFET, JFET and thyristors.

6. The PE module according to claim 1, wherein the semiconductor chips are bipolar- and mos-controlled semiconductor devices.

* * * * *